(12) United States Patent
Fuji et al.

(10) Patent No.: US 11,319,167 B2
(45) Date of Patent: May 3, 2022

(54) FLOTATION CONVEYANCE APPARATUS AND LASER PROCESSING APPARATUS

(71) Applicant: THE JAPAN STEEL WORKS, LTD., Tokyo (JP)

(72) Inventors: Takahiro Fuji, Tokyo (JP); Yoshihiro Yamaguchi, Tokyo (JP)

(73) Assignee: JSW AKTINA SYSTEM CO., LTD., Yokohama (JP)

( * ) Notice: Subject to any disclaimer, the term of this patent is extended or adjusted under 35 U.S.C. 154(b) by 0 days.

(21) Appl. No.: 17/172,775

(22) Filed: Feb. 10, 2021

(65) Prior Publication Data

US 2021/0261358 A1 Aug. 26, 2021

(30) Foreign Application Priority Data

Feb. 26, 2020 (JP) .............................. JP2020-030105

(51) Int. Cl.
  *B65G 51/03* (2006.01)
  *B65G 49/06* (2006.01)

(52) U.S. Cl.
  CPC ............. *B65G 51/03* (2013.01); *B65G 49/06* (2013.01)

(58) Field of Classification Search
  CPC .. B65G 51/03; B65G 49/065; B65G 2207/06; H21L 21/677; H21L 21/67784
  USPC ............. 406/87, 88, 198; 414/676; 162/340; 108/50.13; 65/25.2; 226/97.3; 271/3.23, 271/195
  See application file for complete search history.

(56) References Cited

U.S. PATENT DOCUMENTS

| | | | | |
|---|---|---|---|---|
| 4,211,505 A * | 7/1980 | Babinski | ................ | B65G 51/03 406/19 |
| 4,275,983 A * | 6/1981 | Bergman | ............. | B23Q 16/001 198/345.3 |
| 4,493,548 A * | 1/1985 | Ateya | .................... | B65H 5/228 399/400 |
| 4,618,292 A * | 10/1986 | Judge | .................... | B65G 51/03 198/394 |
| 4,865,491 A * | 9/1989 | Sakurai | ................... | H01L 21/68 406/87 |
| 4,874,273 A * | 10/1989 | Tokisue | ................. | B65G 51/03 406/88 |
| 5,108,513 A * | 4/1992 | Muller | ............. | H01L 21/67787 134/15 |
| 5,927,203 A * | 7/1999 | Gieser | .................... | B41F 21/00 101/419 |
| 6,808,358 B1 * | 10/2004 | Mayerberg, II | ........ | B65H 5/021 406/193 |

(Continued)

FOREIGN PATENT DOCUMENTS

JP    2019-192681 A    10/2019

*Primary Examiner* — Joseph A Dillon, Jr.
(74) *Attorney, Agent, or Firm* — Sughrue Mion, PLLC

(57) ABSTRACT

A flotation conveyance apparatus according to an embodiment includes a flotation unit for floating a substrate by ejecting a gas to a lower surface of the substrate. The flotation unit includes a plurality of ejecting ports provided on a surface facing the substrate and configured to eject the gas, and slits penetrating the flotation unit in a vertical direction. The flotation conveyance apparatus is configured in such a way that the gas staying between a surface of the flotation unit facing the substrate and the substrate is discharged to a lower surface side of the flotation unit through the slits.

18 Claims, 10 Drawing Sheets

(56) References Cited

U.S. PATENT DOCUMENTS

| | | | | |
|---|---|---|---|---|
| 7,269,475 B1* | 9/2007 | Hogg | | B65H 5/228 406/19 |
| 8,008,174 B2* | 8/2011 | He | | H01L 21/6776 438/507 |
| 8,113,761 B2* | 2/2012 | Ahn | | B65G 51/03 414/676 |
| 10,689,209 B2* | 6/2020 | Lautman | | B65G 49/065 |
| 2002/0182047 A1* | 12/2002 | Adam | | B65G 51/03 414/676 |
| 2003/0146340 A1* | 8/2003 | Ebner | | F26B 13/104 242/615.11 |
| 2006/0177297 A1* | 8/2006 | Jung | | B65G 49/063 414/749.1 |
| 2007/0228630 A1* | 10/2007 | Grundmuller | | C03B 33/03 269/71 |
| 2009/0013927 A1* | 1/2009 | Yamasaki | | H01L 21/67173 118/300 |
| 2010/0194012 A1* | 8/2010 | Tatsumi | | B65G 49/061 269/21 |
| 2011/0097160 A1* | 4/2011 | Potofeew | | H01L 21/67784 406/86 |
| 2011/0164930 A1* | 7/2011 | Kim | | H01L 21/67784 406/88 |
| 2011/0268511 A1* | 11/2011 | Iida | | B65G 49/065 406/88 |
| 2014/0161577 A1* | 6/2014 | Richman | | B65G 51/03 414/676 |
| 2015/0239682 A1* | 8/2015 | Wang | | B65G 51/03 414/676 |
| 2015/0314968 A1* | 11/2015 | Van Ostayen | | B65G 51/03 406/88 |
| 2016/0318719 A1* | 11/2016 | Tsunoda | | B65G 51/03 |
| 2019/0088507 A1* | 3/2019 | Suzuki | | F16C 32/0618 |
| 2020/0207555 A1* | 7/2020 | Gorra | | B65G 49/065 |
| 2021/0261359 A1* | 8/2021 | Fuji | | B65G 51/03 |

* cited by examiner

FLOTATION CONVEYANCE APPARATUS AND LASER PROCESSING APPARATUS

INCORPORATION BY REFERENCE

This application is based upon and claims the benefit of priority from Japanese patent application No. 2020-030105, filed on Feb. 26, 2020, the disclosure of which is incorporated herein in its entirety by reference.

BACKGROUND

The present disclosure relates to a flotation conveyance apparatus and a laser processing apparatus. In particular, the present disclosure relates to a flotation conveyance apparatus and a laser processing apparatus that conveys a substrate while floating the substrate.

In a process of manufacturing a liquid crystal display panel, an organic EL panel, and so on, a flotation conveyance apparatus for conveying a substrate while floating the substrate is widely used, because the substrate to be used is large. Japanese Unexamined Patent Application Publication No. 2019-192681 discloses a technique relating to a flotation conveyance apparatus for floating and conveying a substrate by blowing a gas to the substrate.

SUMMARY

There is a problem that a flotation amount of a substrate varies in a flotation conveyance apparatus which conveys a substrate while floating the substrate. In particular, a laser processing apparatus for irradiating a substrate with a laser beam is desired to improve the flotation accuracy of the substrate, because the variation in the flotation amounts of the substrate greatly influences the quality of a film and the like on the laser-processed substrate.

Other problems and novel features will become apparent from the description in the present specification and the accompanying drawings.

An example aspect is a flotation conveyance apparatus includes a flotation unit for floating a substrate by ejecting a gas to a lower surface of the substrate. The flotation unit includes a plurality of ejecting ports provided on a surface facing the substrate and configured to eject the gas, and slits penetrating the flotation unit in a vertical direction. The flotation conveyance apparatus is configured in such a way that the gas staying between a surface of the flotation unit facing the substrate and the substrate is discharged to a lower surface side of the flotation unit through the slits.

A laser processing apparatus according to the example aspect includes the above flotation conveyance apparatus and a laser generation unit configured to generate a laser beam to be applied to the substrate.

According to the above aspect, it is possible to provide a flotation conveyance apparatus and a laser processing apparatus which can improve flotation accuracy of a substrate.

The above and other objects, features and advantages of the present disclosure will become more fully understood from the detailed description given hereinbelow and the accompanying drawings which are given by way of illustration only, and thus are not to be considered as limiting the present disclosure.

DESCRIPTION OF EMBODIMENTS

First Embodiment

Figure 1:
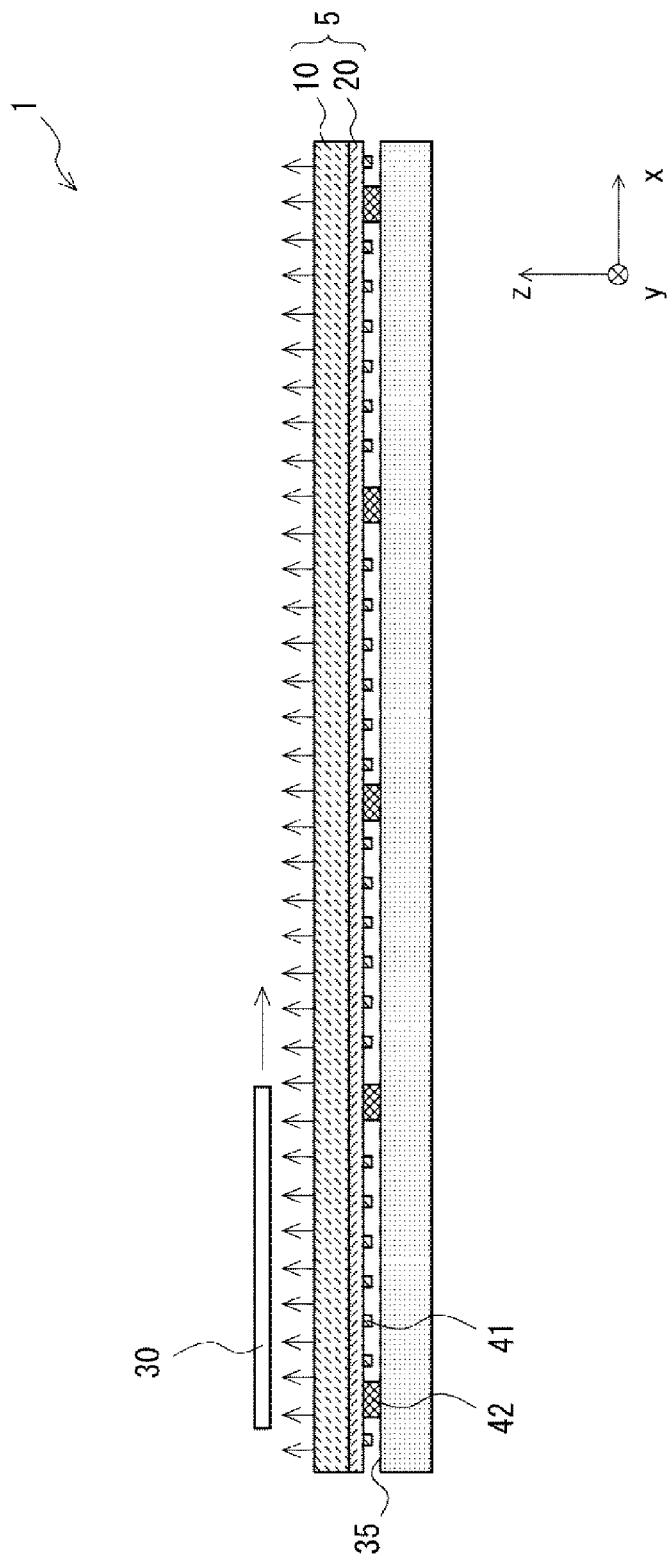
FIG. 1 is a cross-sectional view for explaining a flotation conveyance apparatus according to a first embodiment.

A first embodiment will be described below with reference to the drawings. FIG. 1 is a cross-sectional view for explaining a flotation conveyance apparatus according to the first embodiment. As shown in FIG. 1, a flotation conveyance apparatus 1 according to this embodiment is an apparatus for conveying a substrate 30 in a conveyance direction (a positive direction of an x-axis) while floating the substrate 30 by ejecting a gas to a lower surface of the substrate 30.

As shown in FIG. 1, the flotation conveyance apparatus 1 according to this embodiment includes a flotation unit 5. The flotation unit 5 is composed of an upper plate 10 and a lower plate 20. The upper plate 10 is disposed on an upper side of the flotation conveyance apparatus 1 (a positive side of a z-axis direction). The lower plate 20 is disposed under the upper plate 10 (a negative side of a z-axis direction). For example, the upper plate 10 and the lower plate 20 may be made of a metallic material such as an aluminum alloy which is optionally plated.

Figure 2:
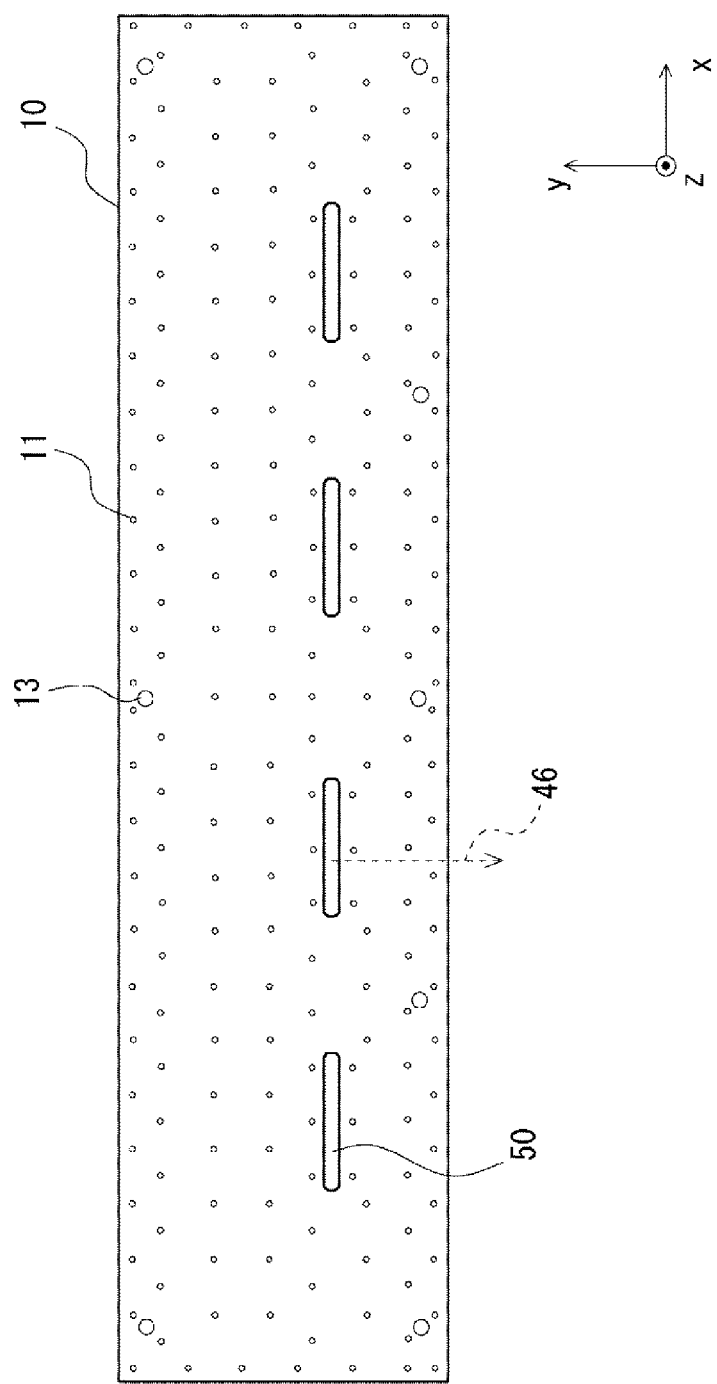
FIG. 2 is a top view of an upper plate of a flotation unit included in the flotation conveyance apparatus.

FIG. 2 is a top view of the upper plate 10 of the flotation unit 5 included in the flotation conveyance apparatus 1. As shown in FIG. 2, a plurality of ejecting ports 11 for ejecting a gas upward are provided in a surface (a surface facing the substrate 30) of the upper plate 10. As shown in FIG. 1, the flotation conveyance apparatus 1 according to this embodiment jets a gas from the plurality of ejecting ports 11 toward the positive side in the z-axis direction, and causes the ejected gas collide with a lower surface of the substrate 30 to thereby float the substrate 30. By moving the substrate 30 in the conveyance direction (the positive direction of the x-axis) using a conveyance unit, which will be described later, the substrate 30 can be conveyed in the conveyance direction while the substrate 30 is being floated.

In the example shown in FIG. 2, the plurality of ejecting ports 11 are regularly arranged at predetermined intervals in the x-axis direction and the y-axis direction. However, in this embodiment, the arrangement of the plurality of ejecting ports 11 is not limited to the arrangement shown in FIG. 2, and may be any arrangement. Further, slits 50 are formed in the upper plate 10. The slits 50 are provided so as to penetrate the flotation unit 5 (the upper plate 10) in the vertical direction. Details of the slits 50 will be described later. A plurality of penetrating holes 13 into which leveling bolts 42 (see FIG. 1), which will be described later, are to be inserted are formed near an outer periphery of the upper plate 10.

Figure 3:
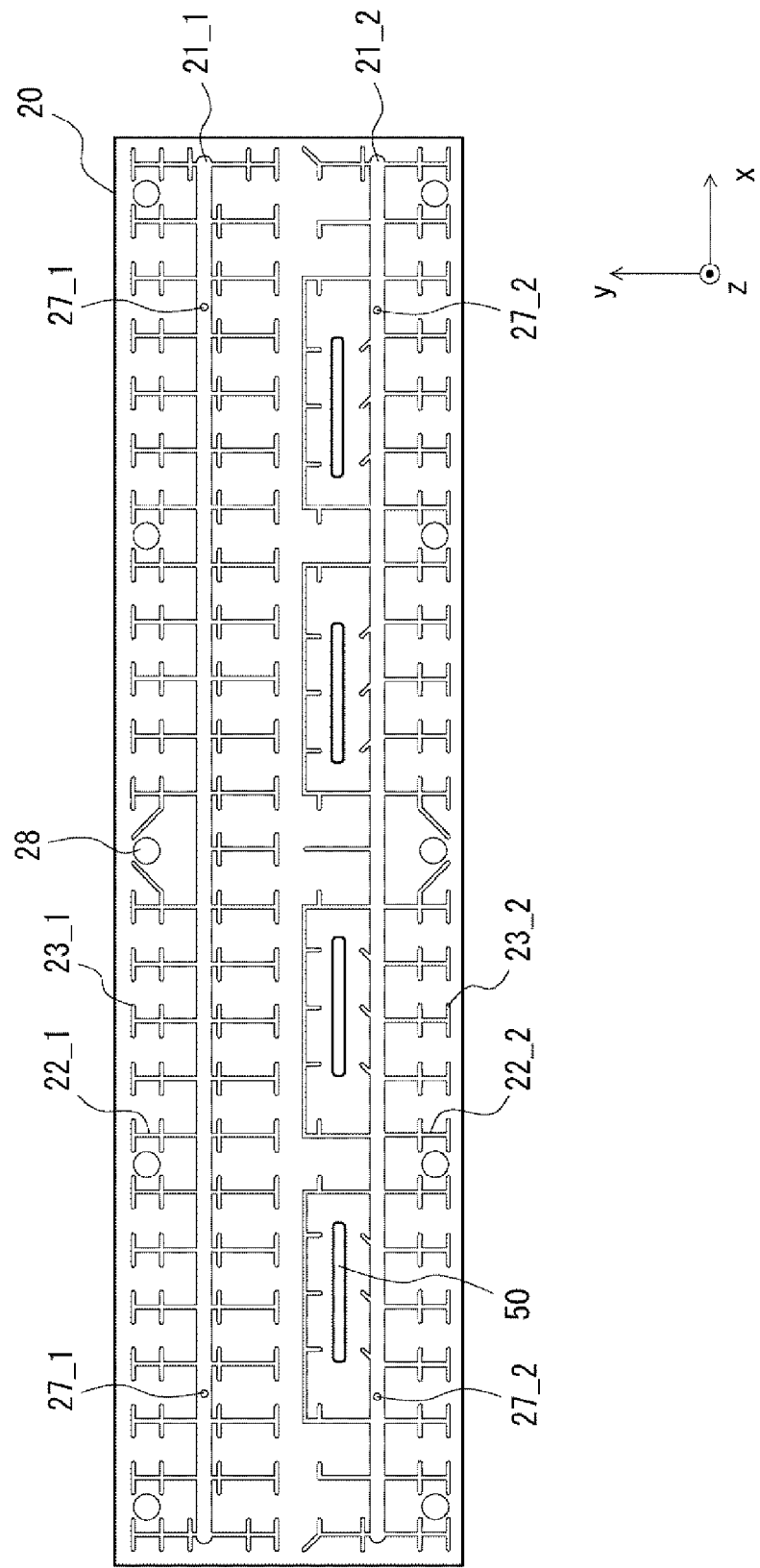
FIG. 3 is a top view of a lower plate of the flotation unit included in the flotation conveyance apparatus.

FIG. 3 is a top view of the lower plate 20 of the flotation unit 5 included in the flotation conveyance apparatus 1. As shown in FIG. 3, the upper surface of the lower plate 20 (a surface on the positive side of the z-axis direction) is provided with a plurality of flow-paths 21_1, 21_2, 22_1, and 22_2 for supplying a gas to the plurality of ejecting ports 11 included in the upper plate 10.

Specifically, as shown in FIG. 3, the first flow-paths 21_1 and 21_2 and the second flow-paths 22_1 and 22_2 are provided on the surface of the lower plate 20. In the following description, the first flow-paths 21_1 and 21_2 are collectively referred to as first flow-paths 21. Likewise, the second flow-paths 22_1 and 22_2 are collectively referred to as second flow-paths 22, and gas supply ports 27_1 and 27_2 are collectively referred to as gas supply ports 27.

The first flow-path 21_1 is provided on the positive side of the y-axis direction of the lower plate 20 so as to extend in the x-axis direction. The gas is supplied to the first flow-path 21_1 from the two gas supply ports 27_1. Similarly, the first flow-path 21_2 is provided on the negative side of the y-axis direction of the lower plate 20 so as to extend in the x-axis direction. The gas is supplied to the first flow-path 21_2 from the two gas supply ports 27_2.

The second flow-paths 22_1 are flow-paths for supplying the gas supplied from the gas supply ports 27_1 through the first flow-path 21_1 to the plurality of ejecting ports 11 (see FIG. 2) provided in the upper plate 10 on the positive side of the y-axis direction of the lower plate 20. Specifically, end parts of the second flow-paths 22_1 on an upstream side are connected to the first flow-path 21_1, and respective end parts 23_1 of the second flow-paths 22_1 on a downstream side are connected to the ejecting ports 11 (see FIG. 2).

Similarly, the second flow-paths 22_2 are flow-paths for supplying the gas supplied from the gas supply port 27_2 through the first flow-path 21_2 to the plurality of ejecting ports 11 (see FIG. 2) provided in the upper plate 10 on the negative side of the y-axis direction of the lower plate 20. Specifically, end parts of the second flow-paths 22_2 on an upstream side are connected to the first flow-path 21_2, and respective end parts 23_2 of the second flow-paths 22_2 on a downstream side are connected to the respective ejecting ports 11 (see FIG. 2).

In the example shown in FIG. 3, the cross-sectional area of the first flow-path 21 is configured to be larger than that of the second flow-path 22. That is, since the first flow-paths 21 function as flow-paths for supplying the gas supplied from the gas supply ports 27 to each of the second flow-paths 22, the amount of the gas passing through the first flow-paths 21 is larger than the amount of the gas passing through the second flow-paths 22. Thus, by making the cross-sectional area of the first flow-paths 21 larger than that of the second flow-paths 22, the resistance of the flow-paths from the gas supply ports 27 to the ejecting ports 11 can be reduced. This reduces the pressure loss of the gas and enables the gas maintained at a pressure about the same as the pressure of the gas supplied to the gas supply ports 27 to be supplied to the ejecting ports 11.

The arrangement of the first flow-paths 21 and the second flow-paths 22 shown in FIG. 3 is an example, and in this embodiment, the arrangement and the number of the first flow-paths 21 and the second flow-paths 22 may be freely determined. That is, the arrangement and the number of the first flow-paths 21 and the second flow-paths 22 may be freely determined as long as the first flow-paths 21 and the second flow-paths 22 are configured to supply the gas from the gas supply ports 27 to the ejecting ports 11 through the first flow-paths 21 and the second flow-paths 22.

The slits 50 are provided in the lower plate 20. The slits 50 are configured to penetrate the flotation unit 5 (the lower plate 20) in the vertical direction. That is, the positions of the slits 50 in the lower plate 20 correspond to the positions of the slits 50 in the upper plate 10. Details of the slits 50 will be described later. Penetrating holes 28 into which the leveling bolts 42 (see FIG. 1), which will be described later, are to be inserted are formed near the outer periphery of the lower plate 20. The positions of the penetrating holes 28 in the lower plate 20 correspond to the positions of the penetrating holes 13 in the upper plate 10.

Figure 4:
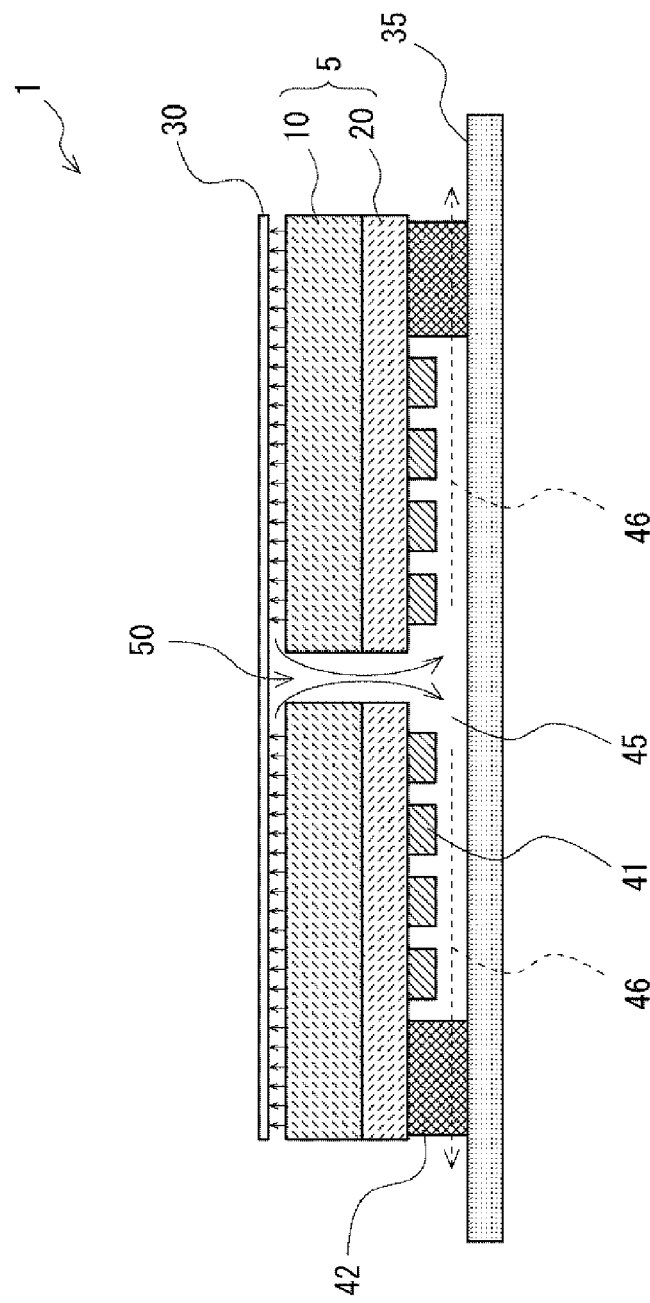
FIG. 4 is a cross-sectional view for explaining the flotation conveyance apparatus according to the first embodiment.

In this embodiment, the upper plate 10 and the lower plate 20 are fastened to each other using a plurality of fastening bolts 41 (see FIGS. 1 and 4). For example, the upper plate 10 and the lower plate 20 may be fastened to each other using the plurality of fastening bolts 41 inserted from the lower plate 20 side.

As shown in FIG. 1, the plurality of leveling bolts 42 projecting downward from the lower surface of the flotation unit 5 are provided in the flotation unit 5. In this embodiment, the flotation unit 5 (flotation conveyance apparatus 1) is installed on the installation surface 35 by bringing the plurality of leveling bolts 42 into contact with an installation surface 35.

The leveling bolts 42 are provided in the penetrating holes 13 and 28 formed in the upper plate 10 and the lower plate 20 of the flotation unit 5 and are configured to be displaced inside the penetrating holes 13 and 28 in the up-down direction (the z-axis direction), respectively. For example, the leveling bolts 42 are configured to be screwed with the flotation unit 5. By rotating the leveling bolts 42, the amount of projection of the leveling bolts 42 from the lower surface of the flotation conveyance apparatus 1 can be changed.

As described above, the flotation conveyance apparatus 1 according to this embodiment supplies the gas supplied from the gas supply ports 27 to the ejecting ports 11 through the first flow-paths 21 and the second flow-paths 22. Thus, as shown in FIG. 1, the gas can be ejected from the plurality of ejecting ports 11 to the lower surface of the substrate 30 to thereby float the substrate 30. Although the substrate 30 is typically a glass substrate, the substrate 30 conveyed by the flotation conveyance apparatus 1 is not limited to a glass substrate.

The gas supply ports 27 (see FIG. 3) for supplying the gas to the flow-paths 21 and 22, which are provided on the lower plate 20, are provided in the lower surface of the lower plate 20. As shown in FIG. 1, when the leveling bolts 42 are brought into contact with the installation surface 35 to install the flotation conveyance apparatus 1, a space is formed between the lower surface of the flotation unit 5 (the lower plate 20) and the installation surface 35. Pipes may be disposed in this space, and the gas may be supplied to the gas supply ports 27 through these pipes.

In this embodiment, the flotation conveyance apparatus 1 may be composed of one flotation unit 5, or a plurality of flotation units 5 may be combined to constitute the flotation conveyance apparatus 1.

As described above, the slits 50 are formed in each of the upper plate 10 and the lower plate 20 constituting the flotation unit 5. As shown in FIG. 4, the slits 50 penetrate the flotation unit 5 in the vertical direction. In the flotation conveyance apparatus 1 according to this embodiment, by providing the slits 50 in the flotation unit 5, the gas staying between the surface of the flotation unit 5 facing the substrate 30 and the substrate 30 can be discharged to the lower surface side of the flotation unit 5 through the slits 50.

More specifically, as shown in FIG. 4, since the flotation unit 5 is installed on the installation surface 35 using the plurality of leveling bolts 42, a space 45 is formed between the lower surface of the flotation unit 5 and the installation surface 35. Thus, the gas staying between the upper surface (the surface facing the substrate 30) of the flotation unit 5 and the substrate 30 is discharged into the space 45 between the lower surface of the flotation unit 5 and the installation surface 35 through the slits 50. The gas discharged into the space 45 between the lower surface of the flotation unit 5 and the installation surface 35 passes through gaps (in FIGS. 2 and 4, an example of a gas flow is indicated by an arrow 46) between the leveling bolts 42 and is discharged to the outside.

More specifically, when the substrate 30 is floated in a state where the substrate 30 covers the entire surface of the flotation unit 5, the gas is likely to stay near the central part of the flotation unit 5 (near inside of the flotation unit 5). When the substrate 30 is floated in a state where the substrate 30 covers a part of the flotation unit 5, the gas is likely to stay near the central part of the upper surface of the flotation unit 5 covered with the substrate 30 (near inside of the flotation unit 5). In the flotation conveyance apparatus 1 according to this embodiment, in a manner described above, the gas staying between the upper surface of the flotation unit 5 and the substrate 30 is discharged into the space 45 between the lower surface of the flotation unit 5 and the installation surface 35 through the slits 50. The gas near the end part of the flotation unit 5 and the gas near the end part of the substrate 30 are discharged in the side surface (xy plane) direction of the space formed between the flotation unit 5 and the substrate 30.

As described above, in the flotation conveyance apparatus 1 according to this embodiment, the gas staying between the flotation unit 5 and the substrate 30 can be discharged to the lower surface side of the flotation unit 5 through the slits 50. It is thus possible to effectively prevent the gas that has ejected to the substrate 30 from staying between the flotation unit 5 and the substrate 30, thereby enabling the attitude of the floating substrate 30 to be stabilized. Therefore, it is possible to provide the flotation conveyance apparatus 1 which can improve the flotation accuracy of the substrate 30.

Figure 5:
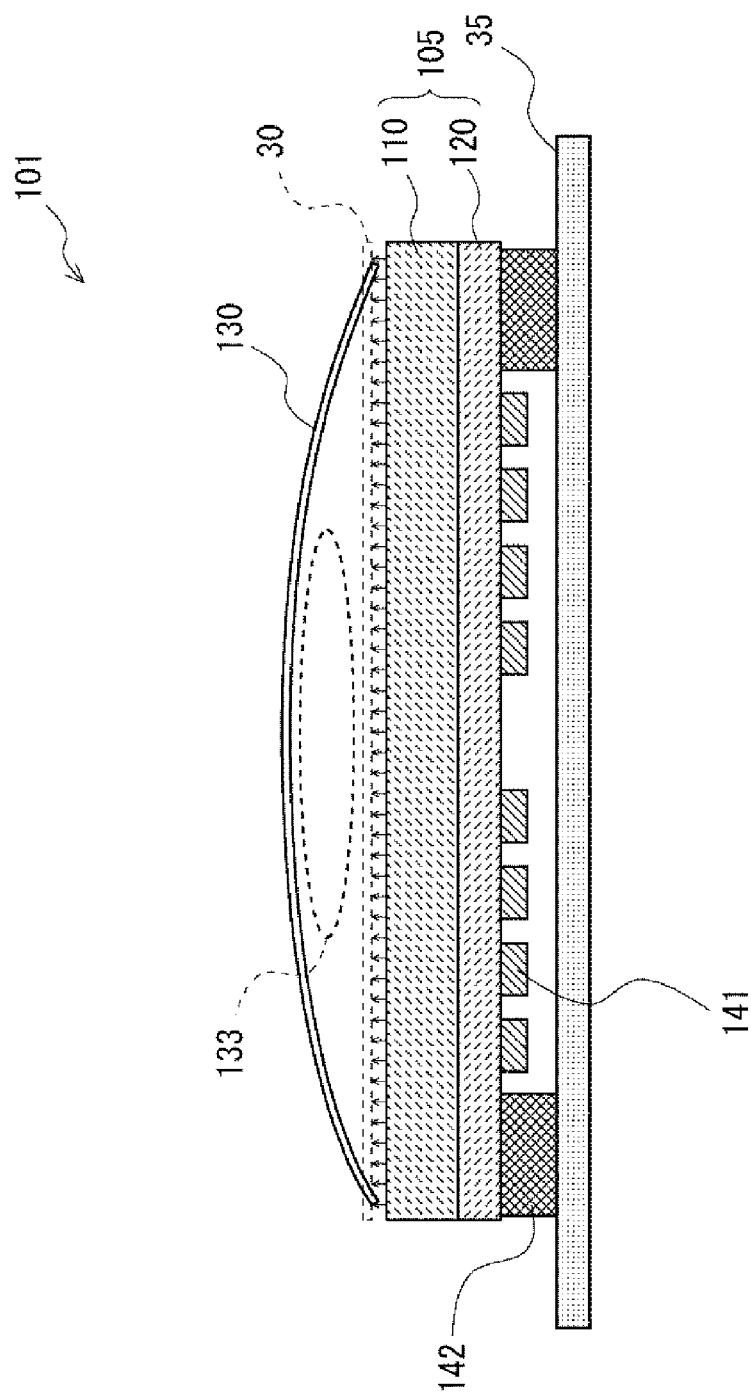
FIG. 5 is a cross-sectional view for explaining a flotation conveyance apparatus according to related art.

FIG. 5 is a cross-sectional view for explaining a flotation conveyance apparatus according to the related art. A flotation conveyance apparatus 101 according to the related art shown in FIG. 5 differs from the flotation conveyance apparatus 1 according to this embodiment shown in FIG. 4 in that the slits 50 are not provided in the flotation conveyance device 101. The configuration of the flotation conveyance apparatus 101 according to the related art other than the slits 50 is the same as that of the flotation conveyance apparatus 1 according to this embodiment. In the flotation conveyance apparatus 101 according to the related art shown in FIG. 5, the respective components are indicated by numerals in the 100 series. More specifically, the flotation conveyance apparatus 101 includes a flotation unit 105, fastening bolts 141, and leveling bolts 142. The flotation unit 105 includes an upper plate 110 and a lower plate 120.

As shown in FIG. 5, the flotation conveyance apparatus 101 according to the related art conveys the substrate 105 while floating the substrate 130 by ejecting a gas from the flotation unit 130 to the lower surface of the substrate 130. At this time, in the flotation conveyance apparatus 101 according to the related art, a part of the gas ejected to the substrate 130 may stay between the flotation unit 105 and the substrate 130 to possibly form an air reservoir 133. That is, when the amount of the gas ejected from the flotation unit 105 and discharged to the outside is small, the gas may stay near the central part (near inside of the flotation unit 105) of the substrate 130 and the flotation unit 105, and the air reservoir 133 may be formed. When the air reservoir 133 is formed in this manner, the attitude of the floating substrate 130 becomes unstable. Specifically, as shown in FIG. 5, the substrate 130 is largely floated at the part where the air reservoir 133 is formed (the central part of the substrate 130), and the flotation amount is reduced at the end parts of the substrate 130. As described above, when the flotation amount is reduced at the end parts of the substrate 130, there arises a problem that a part of the substrate 130 comes into contact with the flotation unit 105 when the substrate 130 is conveyed. For comparison, in FIG. 5, the substrate 30 floated by the flotation conveyance apparatus 1 according to this embodiment shown in FIG. 4 is indicated by a broken line.

On the other hand, in the flotation conveyance apparatus 1 according to this embodiment, as shown in FIG. 4, the slits 50 vertically penetrating the flotation unit 5 are provided, and the gas staying between the flotation unit 5 and the substrate 30 is discharged to the lower surface side of the flotation unit 5 through the slits 50. It is thus possible to effectively prevent the gas ejected to the substrate 30 from staying between the flotation unit 5 and the substrate 30 and prevent the generation of an air reservoir, thereby enabling the attitude of the floating substrate 30 to be stabilized. In this way, it is possible to provide the flotation conveyance apparatus 1 which can improve the flotation accuracy of the substrate.

Further, in the flotation conveyance apparatus 1 according to this embodiment, since the slits 50 are provided to discharge the gas staying between the flotation unit 5 and the substrate 30, there is no need to provide separate suction means for discharging the gas staying between the flotation unit 5 and the substrate. It is thus possible to discharge the gas staying between the flotation unit 5 and the substrate 30 while simplifying the configuration of the flotation conveyance apparatus 1.

Further, the flotation conveyance apparatus 1 according to this embodiment may be configured in such a way that the density of the ejecting ports 11 provided around the slits 50 is higher than the density of the ejecting ports 11 provided in the other region of the flotation unit 5. In other words, the number of the ejecting ports 11 per unit area provided around the slits 50 may be larger than the number of the ejecting ports 11 per unit area provided in other areas of the flotation unit 5. For example, in the configuration example shown in FIG. 2, the number of the ejecting ports 11 per unit area provided around the slits 50 is larger than the number of the ejecting ports 11 per unit area in the region where the slits 50 are not provided. With such configuration, it is possible to effectively prevent the flotation amount of the substrate 30 from being reduced near the slits 50 when the substrate 30 is conveyed, thereby further improving the flotation accuracy of the substrate 30.

In the flotation conveyance apparatus 1 according to this embodiment, the positions where the slits 50 are provided can be freely determined. For example, the slits 50 can be provided at a place where an air reservoir is likely to occur when the substrate 30 is conveyed between the flotation unit 5 and the substrate 30. The place where the air reservoir is likely to occur is, for example, a place where the length of the flotation unit in the width direction (the y-axis direction in FIG. 1) is long or a place where the gas is difficult to flow from the upper surface of the flotation unit 5 in the xy-plane direction. For example, when the conveyance unit (e.g., a conveyance rail) is provided on the side surface of the flotation unit 5, the side surface of the flotation unit 5 on the conveyance unit side is a place where the gas is difficult to flow (see the second and third embodiments, which will be described later).

In the flotation conveyance apparatus 1 according to this embodiment, the slits 50 are preferably provided so that the longitudinal direction of the slits 50 becomes parallel to the conveyance direction of the substrate 30. With such a configuration, the part of the substrate 30 overlapping the opening parts of the slits 50 in a plan view can be reduced at the end parts of the substrate 30 on the downstream side of the conveyance direction. This effectively prevents the end parts of the substrate 30 on the downstream side of the conveyance direction from colliding with the opening parts of the slits 50.

Second Embodiment

Figure 6:
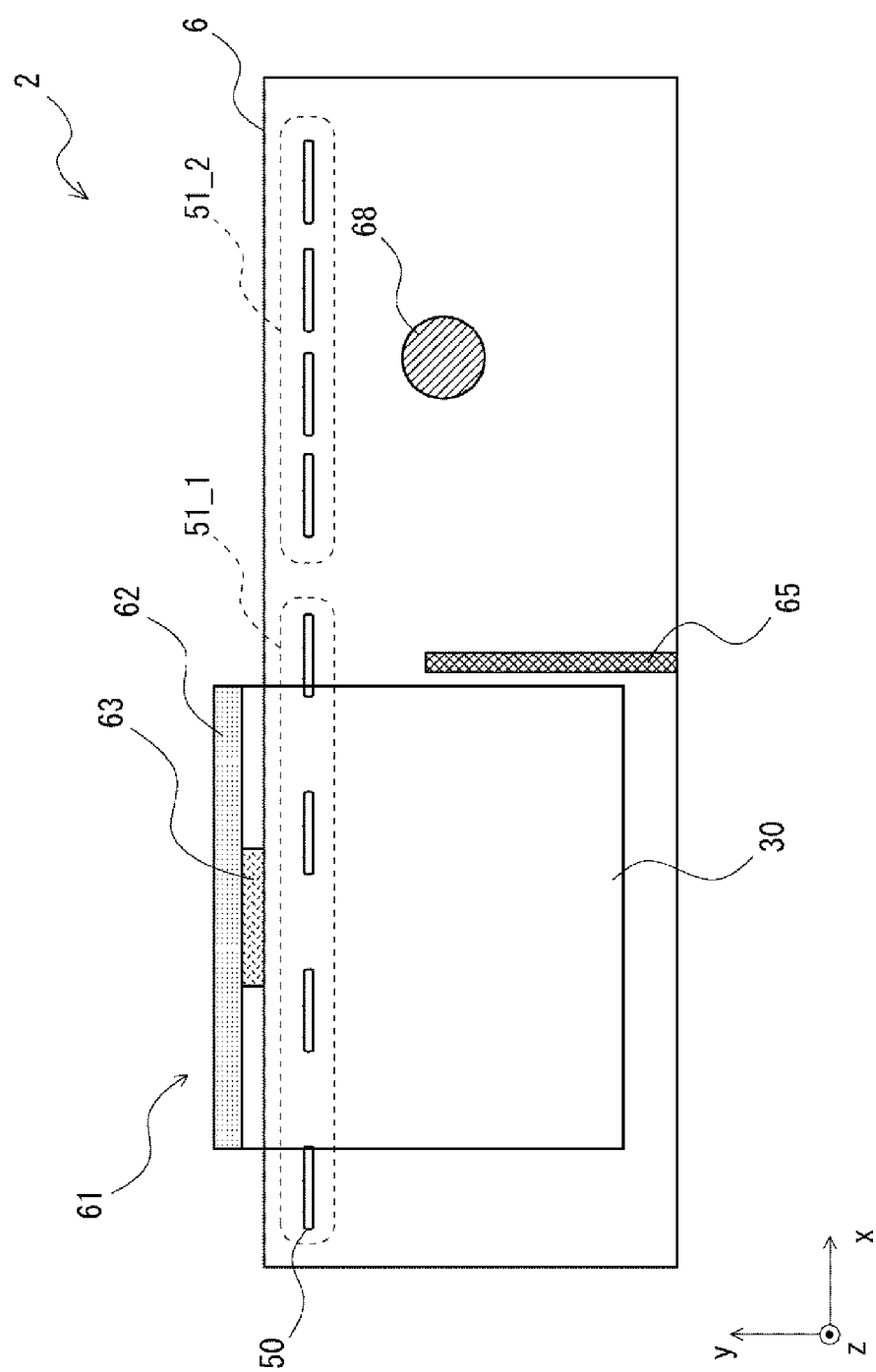
FIG. 6 is a top view for explaining a laser processing apparatus using a flotation conveyance apparatus according to a second embodiment.
Figure 7:
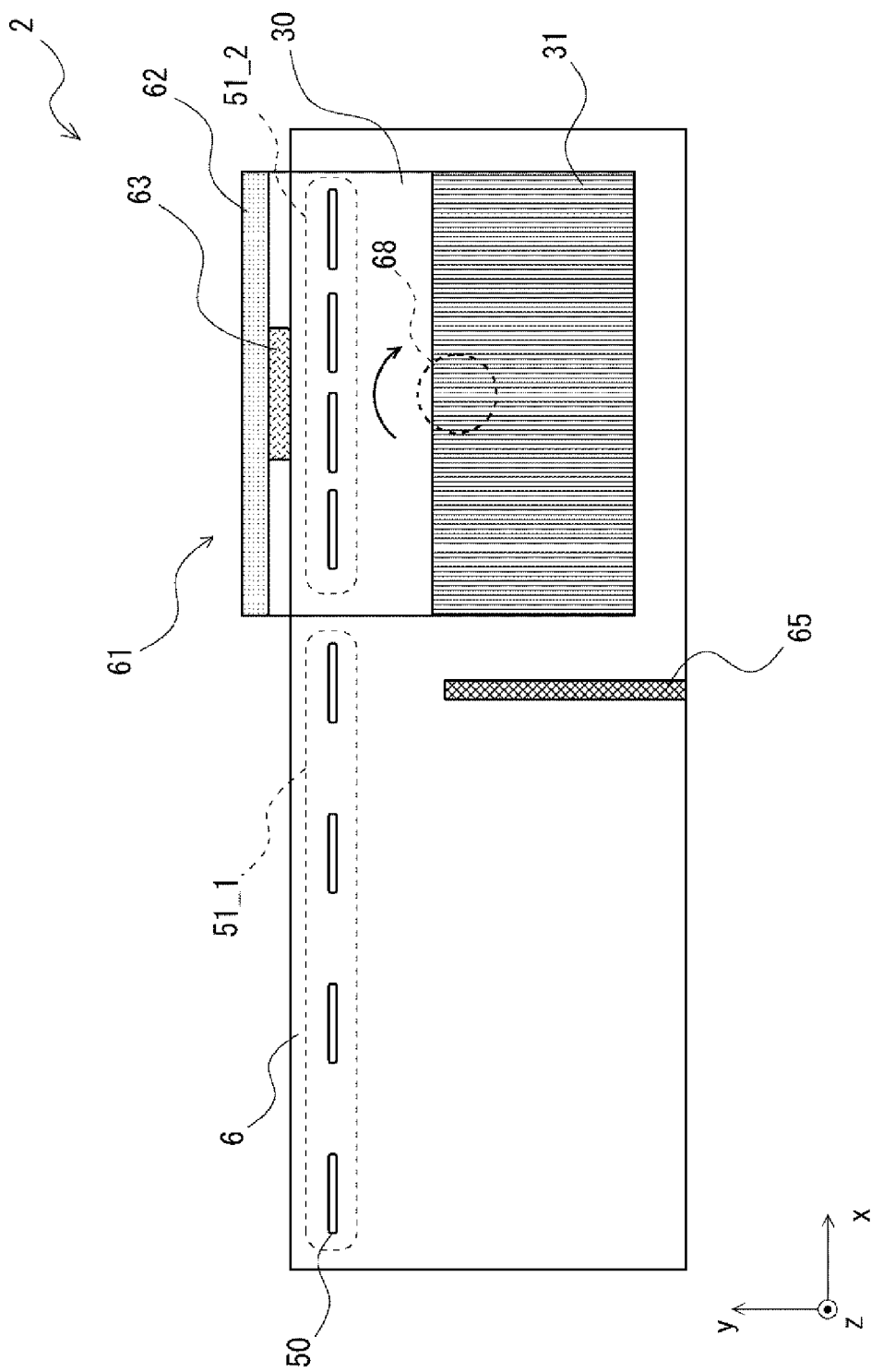
FIG. 7 is a top view for explaining the laser processing apparatus using the flotation conveyance apparatus according to the second embodiment.

Next, a second embodiment will be described. FIGS. 6 and 7 are top views for explaining a flotation conveyance apparatus according to the second embodiment. In this embodiment, a case where the flotation conveyance apparatus according to the first embodiment is applied to a laser processing apparatus will be described. Note that a basic configuration of a flotation conveyance apparatus 2 according to the second embodiment is the same as that of the flotation conveyance apparatus 1 described in the first embodiment, and thus the repeated description is omitted as appropriate.

As shown in FIG. 6, the flotation conveyance apparatus 2 (the laser processing apparatus) according to this embodiment includes a flotation unit 6, a conveyance unit 61, and a laser light source (a laser generation unit) 65. The configuration of the flotation unit 6 is basically the same as that of the flotation unit 5 described in the first embodiment, and thus the repeated description is omitted.

The flotation conveyance apparatus 2 (the laser processing apparatus) according to this embodiment is configured in such a way that the gas is ejected to the lower surface of the substrate 30 using the flotation unit 6 to thereby float the substrate 30, and to convey the substrate 30 in the conveyance direction (the x-axis direction) using the conveyance unit 61. Note that in FIGS. 6 and 7, the ejecting ports 11 are not shown.

As shown in FIG. 6, the conveyance unit 61 includes a holding mechanism 62 and a moving mechanism 63. The holding mechanism 62 holds the substrate 30. For example, the holding mechanism 62 may be constituted using a suction type vacuum adsorption mechanism or a vacuum adsorption mechanism including a porous body. The moving mechanism 63 is connected to the holding mechanism 62. The moving mechanism 63 is configured to move the holding mechanism 62 in the conveyance direction (the x-axis direction). The conveyance unit 61 (the holding mechanism 62 and the moving mechanism 63) is provided on the end part side of the flotation unit 6 in the y-axis direction. The substrate 30 is conveyed by the moving mechanism 63 moving in the conveyance direction while the substrate 30 is held by the holding mechanism 62.

The flotation conveyance apparatus 2 (the laser processing apparatus) according to this embodiment includes a rotation mechanism 68. As shown in FIG. 7, the rotation mechanism 68 is provided on the positive side of the x-axis direction of the flotation unit 6, and is configured to rotate the substrate 30 conveyed to the positive side of the x-axis direction by 180 degrees while holding the horizontal plane (the xy plane) of the substrate 30. That is, the flotation conveyance apparatus 2 (the laser processing apparatus) uses the conveyance unit 61 to convey the substrate 30 to the positive side of the x-axis direction, and irradiates the substrate 30 with a laser beam (a part of the substrate 30 irradiated with a laser beam is indicated by a sign 31) when the substrate 30 passes through the laser light source 65. After that, the substrate 30 is rotated by 180 degrees using the rotation mechanism 68, the substrate 30 is conveyed to the negative side of the x-axis direction, and the substrate 30 is irradiated with a laser beam. By such an operation, the entire surface of the substrate 30 can be irradiated with the laser beams.

The plurality of ejecting ports 11 (see FIG. 2, not shown in FIGS. 6 and 7) are provided in the upper surface of the flotation unit 6, and by ejecting the gas from the plurality of ejecting ports 11 to the lower surface of the substrate 30, the substrate 30 is floated. At this time, the gas that has collided with the lower surface of the substrate 30 moves on the flotation unit 6 along the xy-plane and flows to the outside through the end part side of the flotation unit 6. However, as shown in FIGS. 6 and 7, the conveyance unit 61 is provided on a side of the flotation unit 6 on the positive side of the y-axis direction, so that the gas colliding with the lower surface of the substrate 30 is part to flow toward the positive side of the y-axis direction in this portion, and an air reservoir 133 (see FIG. 5) is likely to be formed. In other words, the conveyance unit 61 (e.g., a conveyance rail) is provided on the side of the flotation unit 6 on the positive side of the y-axis direction. Thus, the conveyance unit 61 can prevent the gas that has collided with the lower surface of the substrate 30 from flowing out of the flotation unit 6.

Thus, in this embodiment, as shown in FIGS. 6 and 7, the plurality of slits 50 are provided on the conveyance unit 61 side of the flotation unit 6 along the conveyance direction (the x-axis direction). In other words, the slits 50 are provided closer to the conveyance unit 61 than the central position in the direction perpendicular to the conveyance direction (the y-axis direction) in the upper surface of the flotation unit 6. The slits 50 are provided so that the longitudinal direction of the slits 50 becomes parallel to the conveyance direction (the x-axis direction) of the substrate.

By providing the slits 50 in this manner, the gas staying between the flotation unit 6 and the substrate 30 can be discharged to the lower surface side of the flotation unit 6 through the slits 50. It is thus possible to effectively prevent the generation of the air reservoir 133 (see FIG. 5) on the conveyance unit 61 side of the flotation unit 6, thereby improving the flotation accuracy of the substrate 30.

In this embodiment, the density of the slits 50 may be higher at the position where the substrate 30 is stationary than the density of the slits 50 at the position where the substrate 30 is continuously moved. That is, as shown in FIG. 7, at a position provided with the rotation mechanism 68 for rotating the substrate 30 in the in-plane direction, the substrate 30 is stationary. At such a position where the substrate 30 is stationary, an air reservoir is more likely to occur than at a position where the substrate 30 is continuously moved (i.e., an air reservoir is more likely to occur at the position on the negative side of the x-axis direction than the position where the rotation mechanism 68 is provided).

Therefore, in this embodiment, the density of the slits 50 is higher at a position 51_1 where the substrate 30 is stationary than the density of the slits 50 at a position 51_2 where the substrate 30 is continuously moved. With such a configuration, it is possible to effectively prevent the generation of an air reservoir at a position where the substrate 30 is stationary.

Third Embodiment

Figure 8:
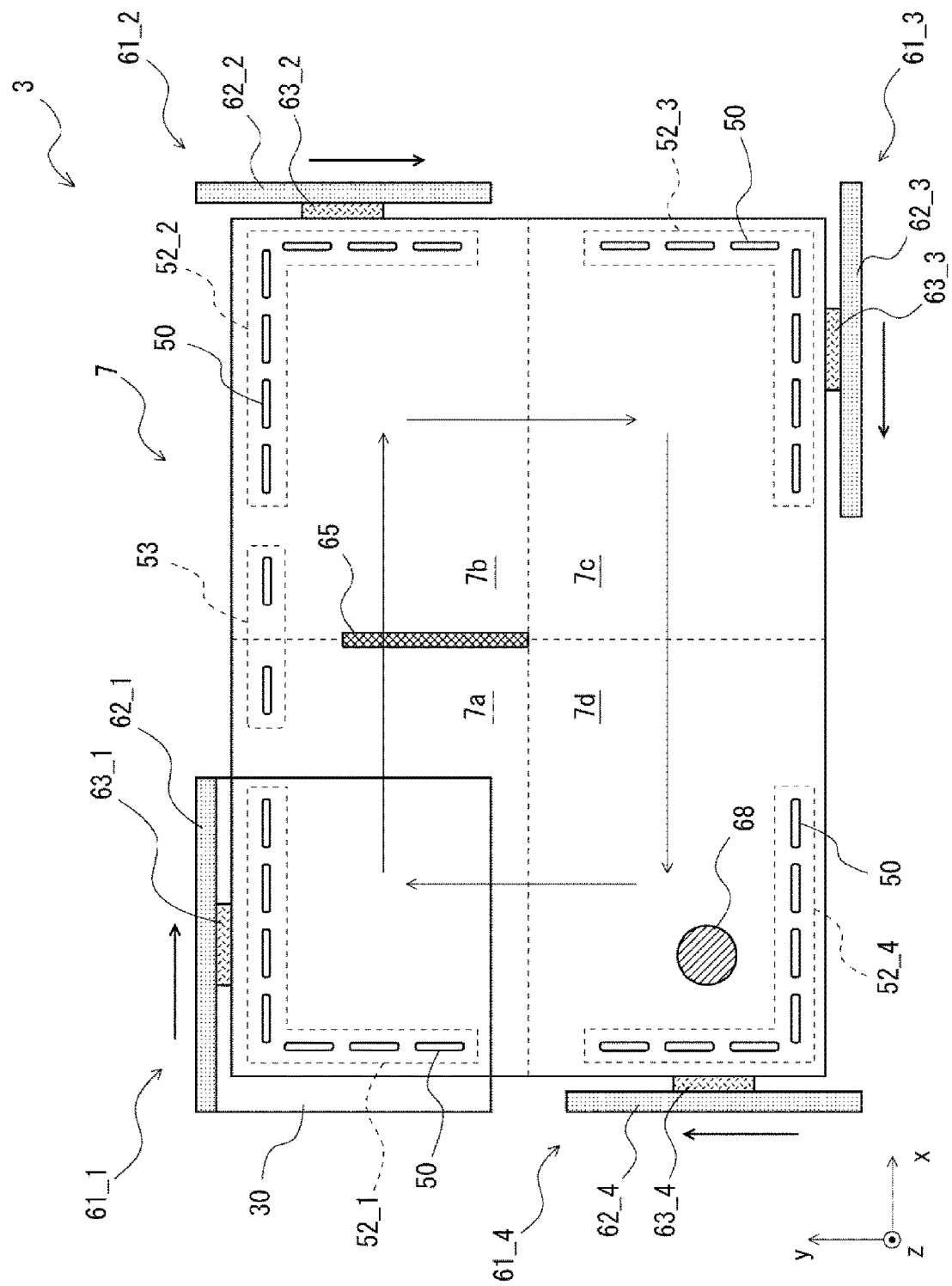
FIG. 8 is a top view for explaining a laser processing apparatus using a flotation conveyance apparatus according to a third embodiment.
Figure 9:
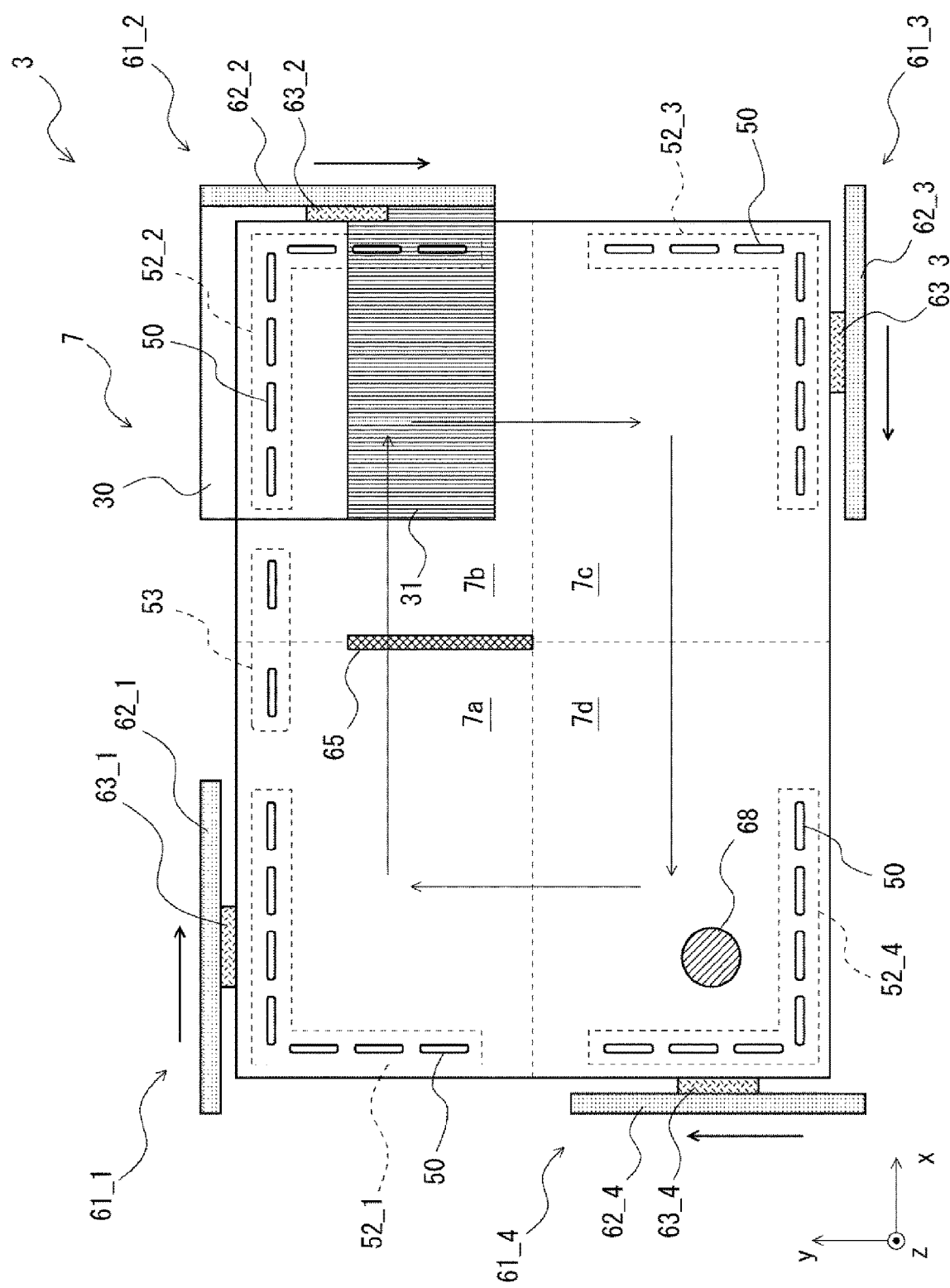
FIG. 9 is a top view for explaining the laser processing apparatus using the flotation conveyance apparatus according to the third embodiment.

Next, a third embodiment will be described. FIGS. 8 and 9 are top views for explaining a flotation conveyance apparatus according to the third embodiment. In this embodiment, a case where the flotation conveyance apparatus according to the first embodiment is applied to a laser processing apparatus will be described. Note that a basic configuration of a flotation conveyance apparatus 3 according to the third embodiment is the same as that of the flotation conveyance apparatus 1 described in the first embodiment, and thus repeated description is omitted as appropriate.

As shown in FIG. 8, the flotation conveyance apparatus 3 (the laser processing apparatus) according to this embodiment includes a flotation unit 7, conveyance units 61_1 to 61_4, and a laser light source 65. A configuration of the flotation unit 7 is basically the same as that of the flotation unit 5 described in the first embodiment, and thus repeated description is omitted.

The flotation unit 7 is configured to eject a gas from the surface of the flotation unit 7, and the gas ejected from the surface of the flotation unit 7 collides with the lower surface of the substrate 30 to thereby float the substrate 30. The flotation unit 7 includes four regions 7a to 7d. In FIGS. 8 and 9, the ejecting ports 11 are not shown.

As shown in FIG. 8, the flotation unit 7 has a rectangular shape in a plan view. Each of the conveyance units 61_1 to 61_4 is provided to convey the substrate 30 along each side of the flotation unit 7. Specifically, the conveyance unit 61_1 is provided on a side of the flotation unit 7 on the positive side of the y-axis direction, and includes a holding mechanism 62_1 and a moving mechanism 63_1. As shown in FIG. 9, the moving mechanism 63_1 moves to the positive side of the x-axis direction while the substrate 30 is held by the holding mechanism 62_1, so that the substrate 30 can be conveyed from the region 7a to the region 7b.

In the flotation conveyance apparatus 3 (the laser processing apparatus) according to this embodiment, the laser light source 65 is provided between the regions 7a and 7b. Thus, when the substrate 30 is conveyed from the region 7a to the region 7b, the substrate 30 is irradiated with a laser beam. In FIG. 9, a part of the surface of the substrate 30 irradiated with a laser beam is indicated by a sign 31.

The conveyance unit 61_2 is provided on a side of the flotation unit 7 on the positive side of the x-axis direction, and includes a holding mechanism 62_2 and a moving mechanism 63_2. The moving mechanism 63_2 moves to the negative side of the y-axis direction while the holding mechanism 62_2 holds the substrate 30, so that the substrate 30 can be conveyed from the region 7b to the region 7c.

The conveyance unit 61_3 is provided on a side of the flotation unit 7 on the negative side of the y-axis direction, and includes a holding mechanism 62_3 and a moving mechanism 63_3. The moving mechanism 63_3 moves to the negative side of the x-axis direction while the holding mechanism 62_3 holds the substrate 30, so that the substrate 30 can be conveyed from the region 7c to the region 7d.

The conveyance unit 61_4 is provided on a side of the flotation unit 7 on the negative side of the x-axis direction, and includes a holding mechanism 62_4 and a moving mechanism 63_4. The moving mechanism 63_4 moves to the positive side of the y-axis direction while the holding mechanism 62_4 holds the substrate 30, so that the substrate 30 can be conveyed from the region 7d to the region 7a.

As described above, in the flotation conveyance apparatus 3 (the laser processing apparatus) according to this embodiment, the flotation unit 7 includes the four regions 7a to 7d (rectangular areas surrounded by solid and dashed lines), and the substrate 30 is processed by being sequentially conveyed through these four regions 7a to 7d. In the flotation conveyance apparatus 3 (the laser processing apparatus) according to this embodiment, since the laser light source 65 is provided between the regions 7a and 7b, when the substrate 30 is conveyed from the region 7a to the region 7b, the substrate 30 is irradiated with a laser beam.

In the region 7d of the flotation unit 7, the rotation mechanism 68 for rotating the substrate 30 by 180 degrees while holding the horizontal plane (the xy plane) of the substrate 30 is provided. That is, the conveyance unit 61_1 is used to convey the substrate 30 from the region 7a to the region 7b, and the substrate 30 is irradiated with a laser beam, and then the substrate 30 is rotated by 180 degrees using the rotation mechanism 68 while the substrate 30 is conveyed by the conveyance units 61_2 to 61_4. Then, by using the conveyance unit 61_1 again to convey the substrate 30 from the region 7a to the region 7b and irradiate the substrate 30 with a laser beam, the entire surface of the substrate 30 can be irradiated with the laser beams.

The plurality of ejecting ports 11 (see FIG. 2, not shown in FIGS. 8 and 9) are provided in the upper surface of the flotation unit 7, and by ejecting the gas from the plurality of ejecting ports 11 to the lower surface of the substrate 30, the substrate 30 is floated. At this time, the gas that has collided with the lower surface of the substrate 30 flows out toward the in-plane direction of the flotation unit 7. However, as shown in FIGS. 8 and 9, since the conveyance units 61_1 to 61_4 are provided around the flotation unit 7, the gas that has collided with the lower surface of the substrate 30 is difficult to flow toward the outside in this part where the conveyance units 61_1 to 61_4 are provided, and the air reservoir 133 (see FIG. 5) is likely to be formed. In other words, since the conveyance units 61_1 to 61_4 (e.g., conveyance rails) are provided so as to surround the periphery of the flotation unit 7, it is possible to prevent the gas that has collided with the lower surface of the substrate 30 from flowing out of the flotation unit 7 by the conveyance units 61_1 to 61_4.

Therefore, in this embodiment, as shown in FIGS. 8 and 9, the plurality of slits 50 are provided along the conveyance direction of the substrate 30 on the flotation unit 7 side where the conveyance units 61_1 to 61_4 are provided. Specifically, the flotation unit 7 is provided with a plurality of slits 50 at a position 52_1 outside the region 7a. Similarly, the plurality of slits 50 are provided in each of a position 52_2 outside the region 7b of the flotation unit 7, a position 52_3 outside the region 7c of the flotation unit 7, and a position 52_4 outside the region 7d of the flotation unit 7. The positions 52_1 to 52_4 correspond to positions where the conveyance units 61_1 to 61_4 pass the substrate 30 over to the next one of the conveyance unit 61_1 to 61_4, and these positions are also a position where the substrate temporarily stays still.

As shown in FIGS. 8 and 9, the slits 50 are provided so that the longitudinal direction of the slit 50 becomes parallel to the conveyance direction of the substrate.

By providing the slits 50 in this manner, the gas staying between the flotation unit 7 and the substrate 30 can be discharged to the lower surface side of the flotation unit 7 through the slits 50. It is thus possible to effectively prevent the generation of the air reservoir 133 (see FIG. 5) near the outer periphery of the flotation unit 7, thereby improving the flotation accuracy of the substrate 30.

In this embodiment, when the substrate 30 is conveyed from the region 7a to the region 7b, the substrate 30 is irradiated with a laser beam. Therefore, when the substrate is conveyed from the region 7a to the region 7b, it is necessary to convey the substrate 30 with particularly high accuracy. To this end, in this embodiment, more slits 50 are further provided at a position 53 near the outer periphery of the regions 7a and 7b of the flotation unit 7. By providing the slits 50 at the position 53 in this manner, when the substrate 30 passes near the laser light source 65, it is possible to effectively prevent the generation of an air reservoir between the substrate 30 and the flotation unit 7. Thus, the substrate 30 can be accurately conveyed in the vicinity of the laser light source 65.

Fourth Embodiment

Figure 10:
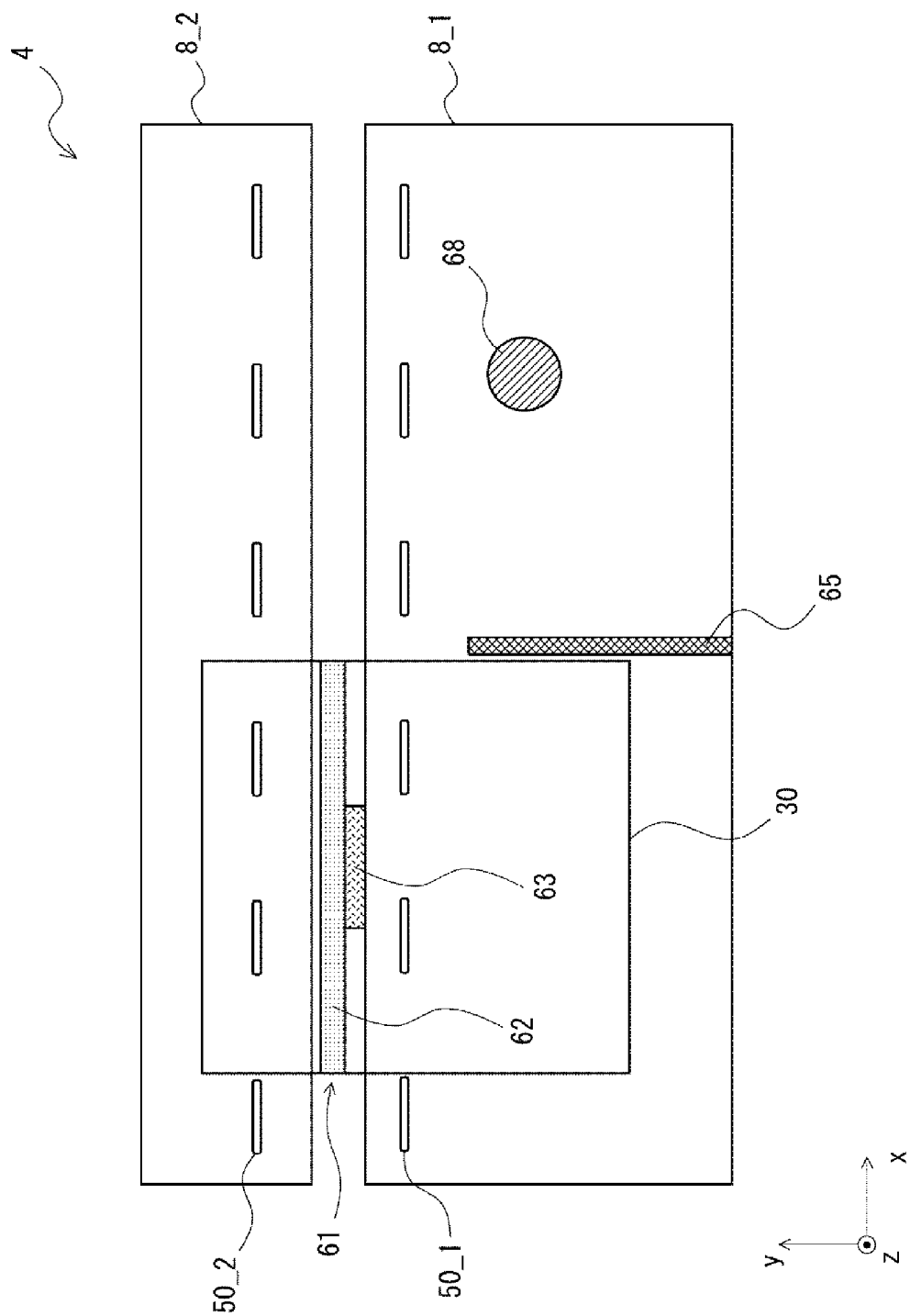
FIG. 10 is a top view for explaining a laser processing apparatus using a flotation conveyance apparatus according to a fourth embodiment.

Next, a fourth embodiment will be described. FIG. 10 is a top view for explaining a flotation conveyance apparatus according to a fourth embodiment. In this embodiment, a configuration example in which a flotation unit 8_2 is further added to the flotation conveyance apparatus 2 (the laser processing apparatus) described in the second embodiment on the positive side of the y-axis direction is shown. Note that a configuration of a flotation conveyance apparatus 4 according to the fourth embodiment is basically the same as the configurations of the flotation conveyance apparatuses 1 and 2 described in the first and second embodiments, and thus repeated description is omitted.

As shown in FIG. 10, the flotation conveyance apparatus 4 (the laser processing apparatus) according to this embodiment includes the flotation units 8_1 and 8_2, a conveyance unit 61, and a laser light source 65. In this embodiment, the flotation unit 8_1 is provided on the negative side of the y-axis direction, and the flotation unit 8_2 is provided on the positive side of the y-axis direction. The conveyance unit 61 is provided between the flotation unit 8_1 and the flotation unit 8_2. A rotation mechanism 68 is provided on the positive side of in the x-axis direction of the flotation unit 8_1. The configuration of the conveyance unit 61 and the rotation mechanism 68 are the same as those of the conveyance unit and the rotation mechanism according to the second embodiment, respectively, and thus the repeated description is omitted.

The flotation conveyance apparatus 4 (the laser processing apparatus) according to this embodiment is configured in such a way that the gas is ejected to the lower surface of the substrate 30 using the flotation units 8_1 and 8_2 to thereby float the substrate 30, and to convey the substrate 30 in the conveyance direction (the x-axis direction) using the conveyance unit 61. Note that in FIG. 10, the ejecting ports 11 are not shown.

In this embodiment, as shown in FIG. 10, a plurality of slits 50_1 are provided in the flotation unit 8_1 on the conveyance unit 61 side. A plurality of slits 50_2 are also provided in the flotation unit 8_2 on the conveyance unit 61 side. The slits 50_1 and 50_2 are provided so that the longitudinal direction of the slits 50_1 and 50_2 becomes parallel to the conveyance direction (the x-axis direction) of the substrate.

Also in this embodiment, by providing the slits 50_1 and 50_2 in this manner, the gas staying between the flotation units 8_1 and 8_2 and the substrate 30 can be discharged through the slits 50_1 and 50_2 to the lower surface side of the flotation units 8_1 and 8_2. It is thus possible to effectively prevent the generation of the air reservoir 133 (see FIG. 5) in the flotation units 8_1 and 8_2 on the conveyance unit 61 side, thereby improving the flotation accuracy of the substrate 30.

In this embodiment, although the configuration in which the conveyance unit 61 is provided between the flotation unit 8_1 and the flotation unit 8_2 has been described, this configuration can also be applied to the flotation conveyance apparatus 3 (see FIG. 8) according to the third embodiment. That is, in the flotation conveyance apparatus 3 according to the third embodiment shown in FIG. 8, the flotation unit may be provided also outside the conveyance unit 61_1 to 61_4.

From the disclosure thus described, it will be obvious that the embodiments of the disclosure may be varied in many ways. Such variations are not to be regarded as a departure from the spirit and scope of the disclosure, and all such modifications as would be obvious to one skilled in the art are intended for inclusion within the scope of the following claims.

What is claimed is:

1. A flotation conveyance apparatus including a flotation unit for floating a substrate by ejecting a gas to a lower surface of the substrate, the flotation unit comprising:
   a plurality of ejecting ports provided on a surface facing the substrate and configured to eject the gas; and
   slits penetrating the flotation unit in a vertical direction, wherein
   the flotation conveyance apparatus is configured in such a way that the gas staying between a surface of the flotation unit facing the substrate and the substrate is discharged to a lower surface side of the flotation unit through the slits,
   wherein
   a density of the ejecting ports provided around the slits is higher than a density of the ejecting ports provided in regions of the flotation unit other than around the slits.

2. The flotation conveyance apparatus according to claim 1, wherein
   a plurality of leveling bolts projecting downward from the lower surface of the flotation unit are provided in the flotation unit,
   the flotation unit is installed on an installation surface by bringing the plurality of leveling bolts into contact with the installation surface, and
   the gas staying between the surface of the flotation unit facing the substrate and the substrate is discharged into a space between the lower surface of the flotation unit and the installation surface through the slits.

3. The flotation conveyance apparatus according to claim 2, wherein
   the gas discharged into the space between the lower surface of the flotation unit and the installation surface is further discharged to outside through gaps between the leveling bolts.

4. The flotation conveyance apparatus according to claim 1, wherein
   the slits are provided so that a longitudinal direction of the slits becomes parallel to a conveyance direction of the substrate.

5. The flotation conveyance apparatus according to claim 1, wherein
a conveyance unit configured to convey the substrate in the conveyance direction while holding the substrate is provided on one side of the flotation unit, and
the slits are provided closer to the conveyance unit than a central position in a direction perpendicular to the conveyance direction in an upper surface of the flotation unit.

6. The flotation conveyance apparatus according to claim 5, wherein
the slits are provided along the conveyance direction on the conveyance unit side of the flotation unit.

7. The flotation conveyance apparatus according to claim 5, wherein
a density of the slits is higher at a position where the substrate is stationary than the density of the slits at a position where the substrate is continuously moved.

8. The flotation conveyance apparatus according to claim 7, wherein
the position where the substrate is stationary is a position where a rotation mechanism for rotating the substrate in an in-plane direction is provided.

9. The flotation conveyance apparatus according to claim 7, wherein
the position where the substrate is stationary is a position where the substrate is conveyred from the conveyance unit to the next conveyance unit.

10. A laser processing apparatus comprising:
a flotation conveyance apparatus including a flotation unit for floating a substrate by ejecting a gas to a lower surface of the substrate; and
a laser generation unit configured to generate a laser beam to be applied to the substrate, wherein the flotation unit comprises:
a plurality of ejecting ports provided on a surface facing the substrate and configured to eject the gas; and
slits penetrating the flotation unit in a vertical direction, wherein
the flotation conveyance apparatus is configured in such a way that the gas staying between a surface of the flotation unit facing the substrate and the substrate is discharged to a lower surface side of the flotation unit through the slits,
wherein
a density of the ejecting ports provided around the slits is higher than a density of the ejecting ports provided in regions of the flotation unit other than around the slits.

11. The laser processing apparatus according to claim 10, wherein
a plurality of leveling bolts projecting downward from the lower surface of the flotation unit are provided in the flotation unit,
the flotation unit is installed on an installation surface by bringing the plurality of leveling bolts into contact with the installation surface, and
the gas staying between the surface of the flotation unit facing the substrate and the substrate is discharged into a space between the lower surface of the flotation unit and the installation surface through the slits.

12. The laser processing apparatus according to claim 11, wherein
the gas discharged into the space between the lower surface of the flotation unit and the installation surface is further discharged to outside through gaps between the leveling bolts.

13. The laser processing apparatus according to claim 10, wherein
the slits are provided so that a longitudinal direction of the slits becomes parallel to a conveyance direction of the substrate.

14. The laser processing apparatus according to claim 10, wherein
a conveyance unit configured to convey the substrate in the conveyance direction while holding the substrate is provided on one side of the flotation unit, and
the slits are provided closer to the conveyance unit than a central position in a direction perpendicular to the conveyance direction in an upper surface of the flotation unit.

15. The laser processing apparatus according to claim 14, wherein
the slits are provided along the conveyance direction on the conveyance unit side of the flotation unit.

16. The laser processing apparatus according to claim 14, wherein
a density of the slits is higher at a position where the substrate is stationary than the density of the slits at a position where the substrate is continuously moved.

17. The flotation conveyance apparatus according to claim 16, wherein
the position where the substrate is stationary is a position where a rotation mechanism for rotating the substrate in an in-plane direction is provided.

18. The laser processing apparatus according to claim 16, wherein
the position where the substrate is stationary is a position where the substrate is conveyred from the conveyance unit to the next conveyance unit.

* * * * *